(12) United States Patent
Nakasha

(10) Patent No.: US 8,451,939 B2
(45) Date of Patent: May 28, 2013

(54) RADIO COMMUNICATION APPARATUS

(75) Inventor: Yasuhiro Nakasha, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 254 days.

(21) Appl. No.: 13/069,750

(22) Filed: Mar. 23, 2011

(65) Prior Publication Data

US 2011/0235741 A1    Sep. 29, 2011

(30) Foreign Application Priority Data

Mar. 26, 2010   (JP) .................................. 2010-72856

(51) Int. Cl.
    *H04L 27/00*    (2006.01)
(52) U.S. Cl.
    USPC ........... 375/295; 375/237; 375/238; 375/239; 332/106; 332/108; 332/109; 332/112
(58) Field of Classification Search
    USPC .................. 375/237, 238, 239, 295; 332/106, 332/108, 109, 112
    See application file for complete search history.

(56) References Cited

U.S. PATENT DOCUMENTS

2009/0129460 A1    5/2009    Nakasha

FOREIGN PATENT DOCUMENTS

| JP | 2000-278332 |    | 10/2000 |
| JP | 2003-521143 | A1 | 7/2003 |
| JP | 2009-88947  | A1 | 4/2009 |

*Primary Examiner* — Siu Lee
(74) *Attorney, Agent, or Firm* — Kratz, Quintos & Hanson, LLP

(57) ABSTRACT

A radio communication apparatus includes a baseband signal generator to generate digital data; a clock generator to generate $2^N$ pulse signals corresponding to the digital data; a selector to select one of the $2^N$ pulse signals; and a short pulse generator to reduce a pulse width of the signal selected by the selector, wherein the $2^N$ pulse signals include a whole-period non-transmission pulse, a whole-period transmission pulse, and $2^N-2$ partial-period transmission pulses, when the partial-period transmission pulse is selected, a band pass filter outputs a signal that lasts for part of a period having a 1-symbol length, when the whole-period non-transmission pulse is selected, the band pass filter outputs a signal attenuated by offsetting signals corresponding to the whole-period non-transmission pulse, and when the whole-period transmission pulse is selected, the band pass filter outputs a signal that lasts for a whole of the period having the 1-symbol length.

11 Claims, 13 Drawing Sheets

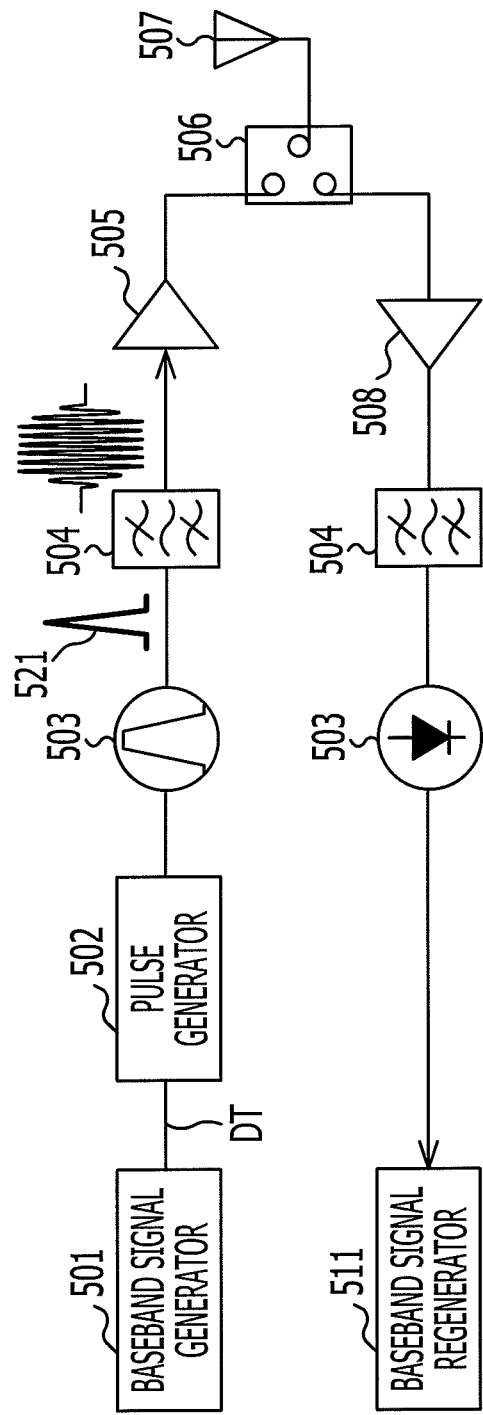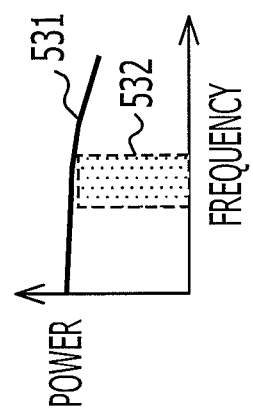

RADIO COMMUNICATION APPARATUS

CROSS-REFERENCE TO RELATED APPLICATION

This application is based upon and claims the benefit of priority of the prior Japanese Patent Application No. 2010-72856, filed on Mar. 26, 2010, the entire contents of which are incorporated herein by reference.

FIELD

The embodiments discussed herein are related to a radio communication apparatus.

BACKGROUND

Impulse radio communication is radio communication that utilizes a radio frequency (RF) pulse having a tiny pulse width, and is expected to be applied to a broadband radio communication system. Pulse position modulation (PPM) is known as a multivalued modulation technique for the impulse radio communication, which has been developed to increase modulation efficiency. For example, Japanese National Publication of International Patent Publication No. 2003-521143, Japanese Laid-open Patent Publication No. 2000-278332, or Japanese Laid-open Patent Publication No. 2009-88947 discusses a technique for the PPM.

FIG. 1 illustrates an example of the PPM. The PPM is a technique that may delay generation of pulses by delay time dependent on a series of data. When the PPM is performed on a series of 3-bit digital data $n_1$, $n_2$, and $n_3$, generation of the pulses for the series of 3-bit digital data $n_1$, $n_2$, and $n_3$ is delayed by $\Delta t \times \{2^2 \times n_1 + 2^1 \times n_2 + n_3\}$, where $n_k$ represents 1 or 0, $\Delta t$ represents a step time, and Tw represents a time width of an RF pulse. In FIG. 1, a 1-symbol length Ts1, which is the length of time from time t1 to time t3, may be expressed by $(2^3-1) \times \Delta t + Tw$, and the transmission speed may be expressed by $3/\{(2^3-1) \times \Delta t + Tw\}$. That is, the transmission speed in the PPM performed on the n-bit digital data may be expressed by $n/\{(2^n-1) \times \Delta t + Tw\}$. According to the expression, $n/\{(2^n-1) \times \Delta t + Tw\}$, efficiency in multivalued modulation may increase as the step time $\Delta t$ is reduced. However, since the step time $\Delta t$ depends on the phase identification sensitivity of a device used as a demodulator, the reduction in the step time $\Delta t$ is limited. For example, when the step time $\Delta t$ is 20 picoseconds (ps) and the time width Tw is 200 ps in the PPM for the 3-bit digital data, the symbol length Ts1 is 340 ps and the transmission speed is 8.8 gigabits per second (Gbps).

SUMMARY

According to an aspect of an embodiment, a radio communication apparatus includes a baseband signal generator configured to generate digital data; a clock generator configured to generate $2^N$ pulse signals corresponding to the digital data having N bits, where N represents an integer being two or more; a selector configured to select one of the $2^N$ pulse signals generated by the clock generator based on the N-bit digital data generated by the baseband signal generator; a short pulse generator configured to reduce a pulse width of the pulse signal selected by the selector; a band pass filter configured to pass a frequency component included in a pass frequency band and attenuate a frequency component not included in the pass frequency band, the frequency components making up the pulse signal having the pulse width reduced by the short pulse generator; an antenna configured to perform radio transmission of a signal passed through the band pass filter, wherein the $2^N$ pulse signals include a whole-period non-transmission pulse, a whole-period transmission pulse, and $2^N-2$ partial-period transmission pulses, the whole-period non-transmission pulse including a first pulse and a second pulse, the whole-period transmission pulse including a third pulse and a fourth pulse, the $2^N-2$ partial-period transmission pulses having approximately the same pulse widths and different phases, when the selector selects the partial-period transmission pulse, the band pass filter outputs a signal having a time width corresponding to part of a period having a 1-symbol length, the signal that the band pass filter outputs when the selector selects a first partial-period transmission pulse included in the $2^N-2$ partial-period transmission pulses, and the signal that band pass filter outputs when the selector selects a partial-period transmission pulse other than the first partial-period transmission pulse included in the $2^N-2$ partial-period transmission pulses have approximately the same time widths and different phases, when the selector selects the whole-period non-transmission pulse, the band pass filter outputs a signal attenuated by offsetting a signal corresponding to the first pulse and a signal corresponding to the second pulse, and when the selector selects the whole-period transmission pulse, the band pass filter outputs a signal having a time width corresponding to a whole of the period having the 1-symbol length.

The object and advantages of the invention will be realized and attained by at least the features, elements, and combinations thereof as particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A illustrates an example of the impulse radio communication apparatus;

FIG. 5B illustrates an example of a pass frequency band of a band pass filter;

DESCRIPTION OF EMBODIMENTS

Figure 2:
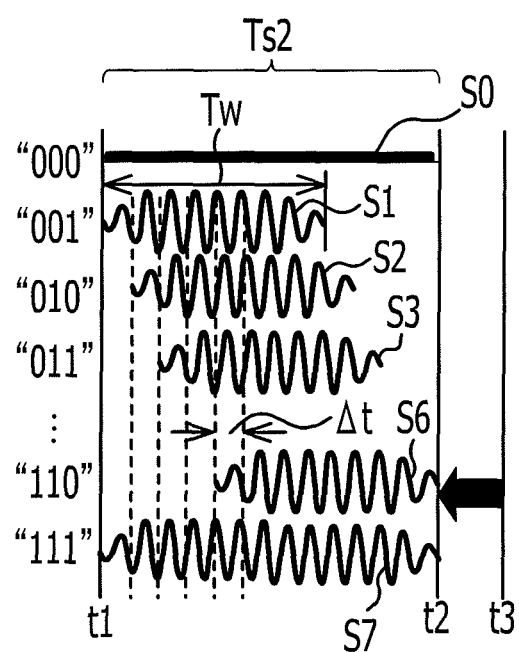
FIG. 2 illustrates an example of a modulation scheme of an impulse radio communication apparatus according to Embodiment 1.

FIG. 2 illustrates an example of a modulation scheme of an impulse radio communication apparatus according to Embodiment 1. For example, 3-bit digital data "000" to "111" are modulated for eight signals S0 to S7, respectively; and each of the signals S0 to S7 has a time width Tw equal to or smaller than a 1-symbol length Ts2. The signals S1 to S6 are partial-period transmission signals; and each of the time widths Tw of the signals S1 to S6 is smaller than the 1-symbol length Ts2. The time widths Tw of the signals S1 to S6 are approximately the same and the phases of the signals S1 to S6 are different by a positive integer multiple of a step time $\Delta t$. The signals S1 to S6 are obtained by performing pulse position modulation (PPM) on the digital data "001" to "110." The modulation signal S1 of the digital data "000" is a radio frequency (RF) pulse (wave packet) with the time width Tw that originates at time t1. Compared with the modulation signal S1, the modulation signal S2 of the digital data "001" is delayed by $\Delta t$, the modulation signal S3 of the digital data "010" is delayed by $2 \times \Delta t$, the modulation signal S4 of the digital data "011" is delayed by $3 \times \Delta t$, the modulation signal S5 of the digital data "100" is delayed by $4 \times \Delta t$, and the modulation signal S6 of the digital data "101" is delayed by $5 \times \Delta t$. The modulation signal S0 of the digital data "000" is a whole-period non-transmission signal for which no RF pulse is transmitted during the entire period corresponding to the 1-symbol length Ts2. The modulation signal S7 of the digital data "111" is a whole-period transmission signal that has the time width Tw substantially equal to the 1-symbol length Ts2.

Figure 1:
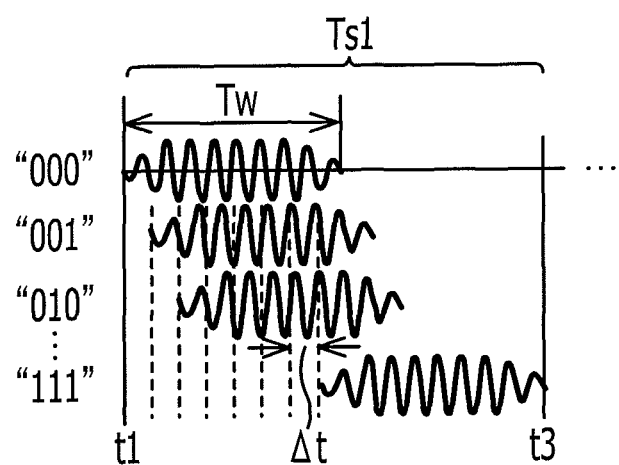
FIG. 1 illustrates an example of a pulse position modulation (PPM)

The modulation scheme in FIG. 2 may be implemented by adding the whole-period non-transmission signal S0 and the whole-period transmission signal S7 to the modulation scheme in FIG. 1. The 1-symbol length Ts2 obtained when N-bit digital data is modulated may be expressed by $(2^N-3) \times \Delta t + Tw$. The 1-symbol length Ts1 in FIG. 1 may be expressed by $(2^N-3) \times \Delta t + Tw$. The 1-symbol length Ts2 is the length of time from the time t1 to time t2 and is shorter than the 1-symbol length Ts1 in FIG. 1 by $2 \times \Delta t$, which is the length of time from the time t1 to the time t3. Due to the reduced 1-symbol length Ts2, modulation efficiency may be increased.

The transmission speed in FIG. 2 may be $N/\{(2^N-3) \times \Delta t + Tw\}$ bits per second (bps). The transmission speed in FIG. 1 may be $N/\{(2^N-1) \times \Delta t + Tw\}$ (bps). When N that represents the number of bits is three, the time width Tw is 200 ps, and the step time $\Delta t$ is 20 picoseconds (ps), the transmission speed in FIG. 1 is 8.8 gigabits per second (Gbps) and the transmission speed in FIG. 2 is 10.0 Gbps. Compared to the transmission speed in FIG. 1, the transmission speed in FIG. 2 may be increased by approximately 13.3%.

When the 1-symbol length Ts2 in FIG. 2 is approximately the same as the 1-symbol length Ts1 in FIG. 1, the step time $\Delta t$ in FIG. 2 may be increased by approximately 40% to 28 ps. As a result, load on hardware, such as a transistor, may be reduced and a cheaper transistor may be used in the impulse radio communication apparatus.

As described above, in the modulation scheme in FIG. 2, the transmission speed (that is, the modulation efficiency) may be increased by adding the whole-period non-transmission signal S0 and the whole-period transmission signal S7 to the signals S1 to S6 subjected to the PPM to reduce the total of the step times $\Delta t$ and decrease the 1-symbol length Ts2. To generate the whole-period non-transmission signal S0 and the whole-period transmission signal S7, methods that utilize features of the impulse radio communication system are used as described below.

Figure 3A:
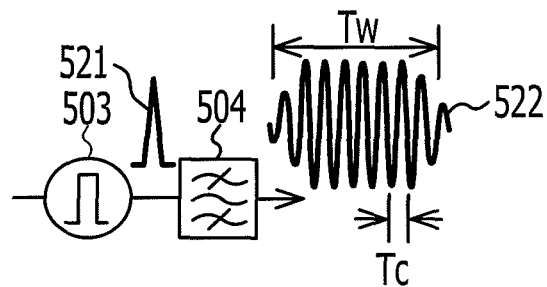
FIG. 3A illustrates an example of a transmission unit of the impulse radio communication apparatus.
Figure 3B:
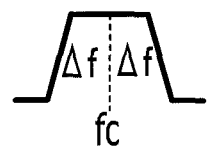
FIG. 3B illustrates an example of a pass frequency band of a band pass filter.
Figure 3C:
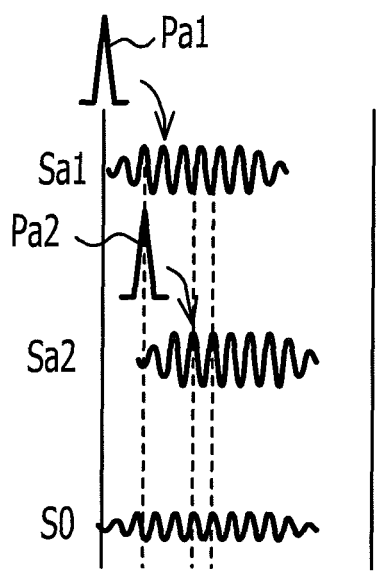
FIG. 3C illustrates an example of a generation method of a whole-period non-transmission signal.

FIG. 3A illustrates an example of a transmission unit of the impulse radio communication apparatus. FIG. 3B illustrates an example of a pass frequency band of a band pass filter 504. FIG. 3C illustrates an example of the generation method of the whole-period non-transmission signal S0. As illustrated in FIG. 3A, the impulse radio communication apparatus includes a short pulse generator 503 and the band pass filter 504. As described above, the whole-period non-transmission signal S0 is generated by the method that utilizes the features of the impulse radio system. The short pulse generator 503 generates a short pulse signal 521 that is tiny and corresponds to the N-bit digital data. For example, the half value width of the short pulse signal 521 is 10 ps or less, and the short pulse signal 521 has broadband energy from a direct current band to a millimeter wave band. The band pass filter 504 passes frequency components included in a desired pass frequency band of the short pulse signal 521, attenuates frequency components not included in the desired pass frequency band, and outputs an RF pulse (wave packet) 522. The RF pulse 522 is transmitted wirelessly through an antenna after having been amplified. As illustrated in FIG. 3B, the pass frequency band of the band pass filter 504 may be $fc \pm \Delta f$, where fc represents the center frequency of the pass frequency band of the band pass filter 504.

Referring again to FIG. 3A, the RF pulse 522 is a pulse that oscillates at RF pulse oscillation cycles Tc and has the time width Tw. Each of the RF pulse oscillation cycles Tc may be $1/fc$. The time width Tw may be approximately $1/(2 \times \Delta f)$. For example, when fc is 100 gigahertz (GHz) and $\Delta f$ is 2.5 GHz, the RF pulse 522 that oscillates with the center frequency fc of 100 GHz and has the time width Tw of 200 ps is generated as a transmission signal.

When the above-described characteristics of the transmission signal generated by the impulse radio communication system are utilized, the whole-period non-transmission signal S0 may be generated by the method illustrated in FIG. 3C. When the band pass filter 504 receives a first short pulse Pa1 from the short pulse generator 503, the band pass filter 504 outputs an RF pulse Sa1. After that, when the band pass filter 504 receives a second short pulse Pa2 from the short pulse generator 503, the band pass filter 504 outputs an RF pulse Sa2. The short pulse generator 503 generates the second short pulse Pa2 after $(2 \times k-1)/(2 \times fc)$ seconds after the generation of the first short pulse Pa1, where k represents a positive integer. That is, the second short pulse Pa2 is generated after a time corresponding to an odd multiple of a half of the oscillation cycle Tc after the generation of the first short pulse Pa1. Accordingly, the band pass filter 504 outputs the whole-period non-transmission signal S0 attenuated as a result of superimposing the RF pulses Sa1 and Sa2 with opposite phases and offsetting the RF pulses Sa1 and Sa2. Since the RF pulses Sa1 and Sa2 are offset by each other, no RF pulse is output as the whole-period non-transmission signal S0 during the whole of the period corresponding to the 1-symbol length Ts2.

Figure 4:
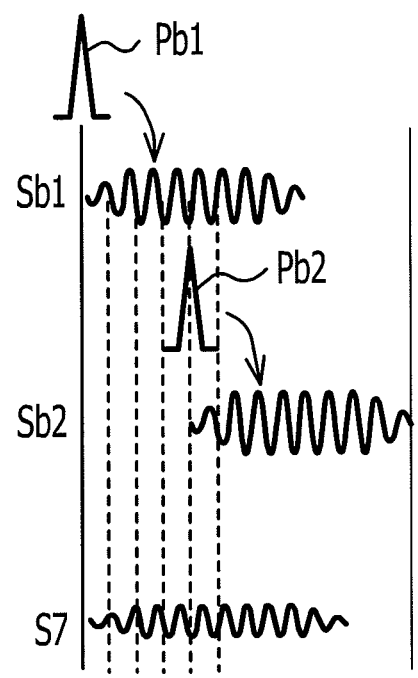
FIG. 4 illustrates an example of a generation method of a whole-period transmission signal.

FIG. 4 illustrates an example of the generation method of the whole-period transmission signal S7. When the band pass filter 504 receives a third short pulse Pb1 from the short pulse generator 503, the band pass filter 504 outputs an RF pulse Sb1. After that, when the band pass filter 504 receives a fourth short pulse Pb2 from the short pulse generator 503, the band pass filter 504 outputs an RF pulse Sb2. The short pulse generator 503 generates the fourth short pulse Pb2 after m/fc seconds after the generation of the third short pulse Pb1, where m represents a positive integer. That is, the fourth short pulse Pb2 is generated after a time corresponding to a positive integral multiple of the oscillation cycle Tc after the generation of the third short pulse Pb1. Accordingly, the band pass filter 504 outputs the whole-period transmission signal S7 for which the RF pulses Sb1 and Sb2 with approximately the same phase are superimposed on each other. The RF pulse that is obtained by superimposing the RF pulses Sb1 and Sb2 with approximately the same phase on each other and is longer than the RF pulses Sb1 and Sb2 is output as the whole-period transmission signal S7. For example, when the PPM is performed on 3-bit digital data, the whole-period transmission, which lasts for the 1-symbol length Ts2, may be carried out by generating the third short pulse Pb1 at the beginning of the 1-symbol length Ts2 and generating the fourth short pulse Pb2 after $(2^3-2) \times \Delta t = 6 \times \Delta t$ seconds after the beginning of the 1-symbol length Ts2. In this case, when the step time $\Delta t$ is set to a positive integral multiple of the RF pulse oscillation cycle Tc (=1/fc), the RF pulses Sb1 and Sb2 with approximately the same phase are superimposed on each other. When the 1-symbol length Ts2 is large, the whole-period transmission signal S0 may be generated by generating three or more short pulses and superimposing three or more RF pulses that have approximately the same phase.

FIG. 5A illustrates an example of the impulse radio communication apparatus. FIG. 5B illustrates an example of the pass frequency band of the band pass filter 504. The impulse radio communication apparatus includes a baseband signal generator 501, a pulse generator 502, the short pulse generator 503, the band pass filter 504, a transmission amplifier 505, a switch 506, an antenna 507, a reception amplifier 508, a band pass filter 509, a detector 510, and a baseband signal regenerator 511. The baseband signal generator 501, the pulse generator 502, the short pulse generator 503, the band pass filter 504, and the transmission amplifier 505 are included in a transmission device. The baseband signal regenerator 511, the detector 510, the band pass filter 509, and the reception amplifier 508 are included in a reception device.

The transmission device is described below. The baseband signal generator 501 generates N-bit digital data DT as transmission data. For example, the baseband signal generator 501 generates one of the eight pieces of 3-bit digital data "000" to "111" as illustrated in FIG. 2. The pulse generator 502 generates a pulse signal based on the N-bit digital data DT generated by the baseband signal generator 501. The pulse generator 502 is described in detail below with reference to FIG. 6. The short pulse generator 503 reduces the pulse width of the pulse signal generated by the pulse generator 502 and outputs the short pulse 521. For example, the short pulse generator 503 generates an impulse by reducing the pulse width. The band pass filter 504 passes frequency components in a certain pass frequency band, which are included in frequency components of the short pulse 521 having the reduced pulse width. Further, the band pass filter 504 attenuates frequency components not included in the certain pass frequency band and outputs the RF pulse (wave packet) 522.

FIG. 5B illustrates an example of a pass frequency band 532 of the band pass filter 504. Short pulse (impulse) characteristics 531 represent frequency characteristics of the short pulse 521. The RF pulse 522 has frequency components that are included in the short pulse characteristics 531 and correspond to the pass frequency band 532. For example, an available frequency band is limited for an ultra wide band (UWB). The band pass filter 504 is used to satisfy the limitations on the frequency band.

As illustrated in FIG. 2, the band pass filter 504 outputs the whole-period non-transmission signal S0 when the digital data DT indicates "000." When the digital data DT indicates "001," the band pass filter 504 outputs the partial-period transmission signal S1. When the digital data DT indicates "010," the band pass filter 504 outputs the partial-period transmission signal S2. When the digital data DT indicates "011," the band pass filter 504 outputs the partial-period transmission signal S3. When the digital data DT indicates "100," the band pass filter 504 outputs the partial-period transmission signal S4. When the digital data DT indicates "101," the band pass filter 504 outputs the partial-period transmission signal S5. When the digital data DT indicates "110," the band pass filter 504 outputs the partial-period transmission signal S6. When the digital data DT indicates "111," the band pass filter 504 outputs the whole-period transmission signal S7. The transmission amplifier 505 amplifies the RF pulse 522 and wirelessly transmits the amplified RF pulse using the switch 506 and the antenna 507. In the transmission mode, the switch 506 causes the transmission amplifier 505 and the antenna 507 to be coupled to each other.

The reception device is described below. In the reception mode, the switch 506 causes the antenna 507 and the reception amplifier 508 to be coupled to each other. The reception amplifier 508 receives the signals S0 to S7 in FIG. 2 that are input from another impulse radio communication apparatus through the antenna 507 and the switch 506, and amplifies the received signals S0 to S7. The band pass filter 509 performs filtering on the output signal of the reception amplifier 508 to allow a certain pass frequency band. The detector 510 detects the output signal of the band pass filter 509 and outputs the detected signal. The baseband signal regenerator 511 receives the output signal of the detector 510 and regenerates the received data. For example, when the signals S0 to S7 in FIG. 2 are input, the baseband signal regenerator 511 regenerates the signals S0 to S7 as the 3-bit digital data "000" to "111," respectively.

A radio communication apparatus with an impulse system may be used in a UWB radio communication system utilizing, for example, a microwave band, a quasi-millimeter-wave band, or the UWB. Compared to a narrowband communication system, the impulse system has advantages including an oscillator or a mixer not being needed, the reduction in any structural complication, and the reduction in the cost of an RF section. The impulse system may perform broadband radio transmission with the speed of 10 Gbps or more in a millimeter-wave band where a broadband may be used.

Figure 6:
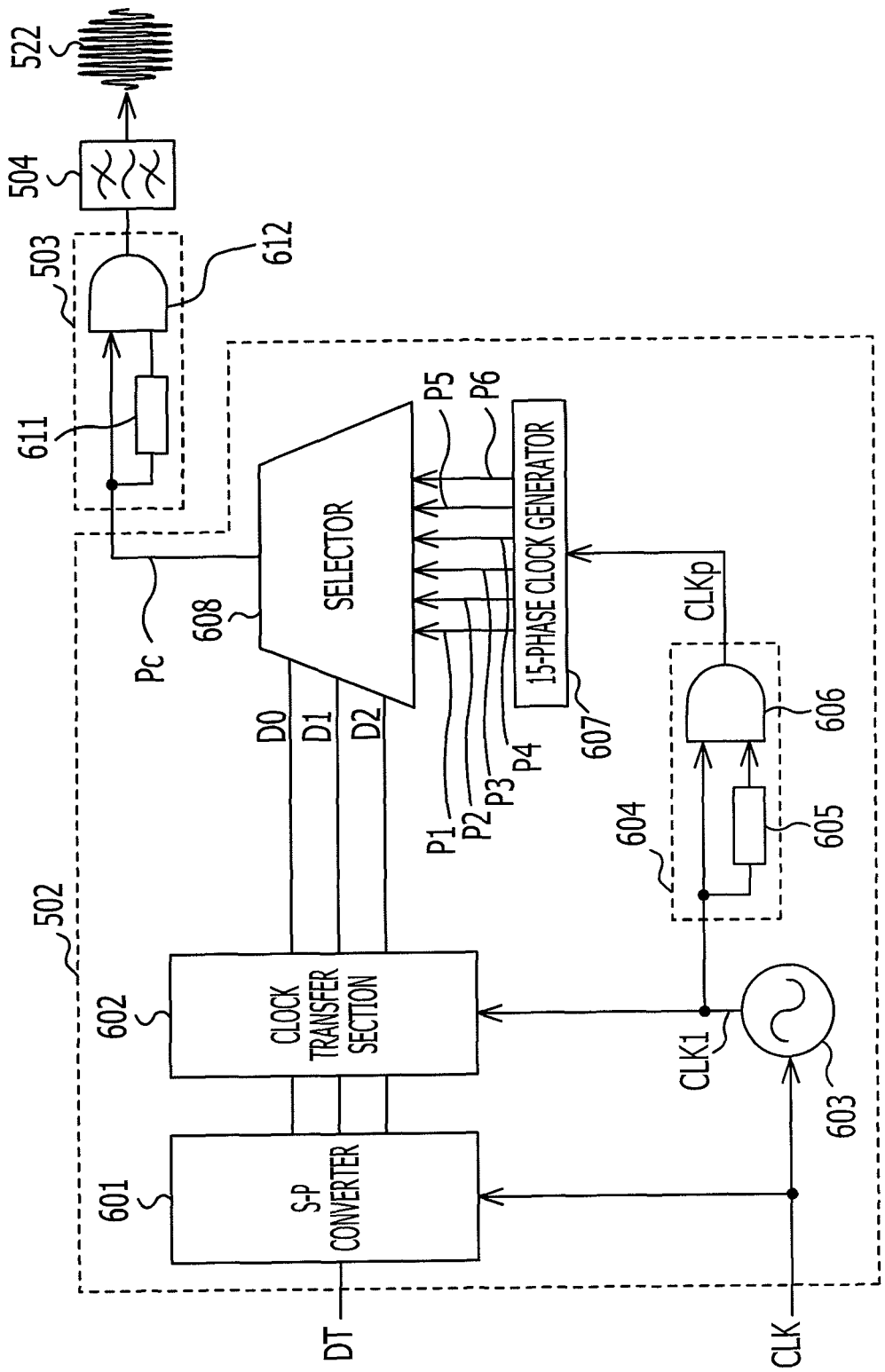
FIG. 6 illustrates examples of a pulse generator, a short pulse generator, and the band pass filter in FIG. 5A.

FIG. 6 illustrates examples of the pulse generator 502, the short pulse generator 503, and the band pass filter 504 in FIG. 5A. For example, the impulse radio communication apparatus may be an impulse radio communication apparatus that operates with the transmission speed of 10 Gbps in the frequency band of 100 GHz. The pass frequency band of the band pass filter 504 may be 100±2.5 GHz. For example, the band pass filter 504 may be made up of coupled microstrip lines that are formed at a plurality of stages on an alumina substrate.

The pulse generator 502 includes a serial to parallel (S-P) converter 601, a clock transfer section 602, a clock generator 603, a duty ratio conversion circuit 604, a 15-phase clock generator 607, and a selector 608. The duty ratio conversion circuit 604 includes a delay circuit 605 and an AND circuit 606. The short pulse generator 503 includes a delay circuit 611 and an AND circuit 612.

For example, the serial-parallel converter 601 is synchronized with a clock signal CLK of 10 GHz and converts the serial digital data DT of 10 Gbps into 3-bit parallel digital data. The clock generator 603 is synchronized with the clock signal CLK of 10 GHz and generates a clock signal CLK1 of 3.33 GHz. For example, the clock transfer section 602 may be a first-in first-out (FIFP) circuit. The clock transfer section 602 is synchronized with the clock signal CLK1, transfers the data of the clock signal CLK of 10 GHz, which is output from the serial-parallel converter 601, to the data of the clock signal CLK1 of 3.33 GHz, and outputs 3-bit parallel digital data D0 to D2. The duty ratio conversion circuit 604 changes the duty ratio of the clock signal CLK1 and outputs a clock signal CLKp. For example, the high-level period of the clock signal CLK may be $2 \times \Delta t = 2 \times 20$ ps=40 ps, where the step time $\Delta t$ may be 20 ps. The delay circuit 605 in the duty ratio conversion circuit 604 generates the clock signal CLKp having the duty ratio of 40:260. The delay circuit 605 delays the clock signal CLK1 and outputs the delayed clock signal CLK1. The AND circuit 606 outputs an AND signal of the output signal of the delay circuit 605 and the clock signal CLK1 as the clock signal CLKp. The 15-phase clock generator 607 receives the clock signal CLKp and outputs pulse signals P1 to P6 to the selector 608.

Figure 7A:
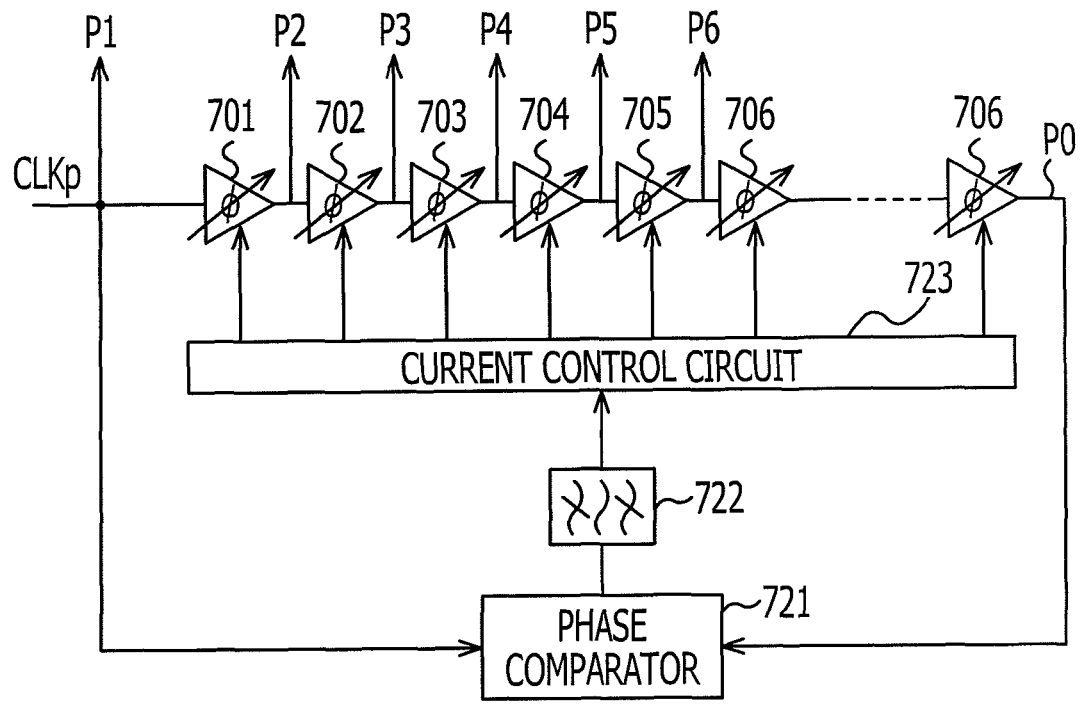
FIG. 7A illustrates an example of a 15-phase clock generator.
Figure 7B:
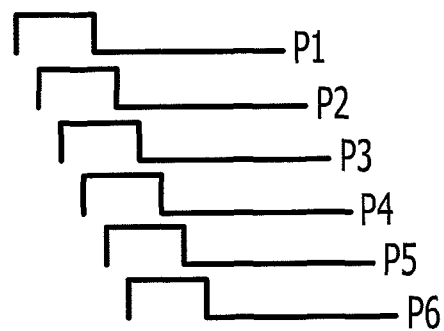
FIG. 7B illustrates examples of pulse signals generated by the 15-phase clock generator.

FIG. 7A illustrates an example of the 15-phase clock generator 607. FIG. 7B illustrates examples of the pulse signals P1 to P6 generated by the 15-phase clock generator 607. The 15-phase clock generator 607 may be a delay lock loop (LOOP) circuit that includes Ts2/$\Delta t$ variable delay circuits 701 to 715, a phase comparator 721, a low-pass filter 722, and a current control circuit 723. When the 1-symbol length Ts2 is 300 ps and the step time $\Delta t$ is 20 ps, the variable delay circuits 701 to 715 are desired.

The pulse signal P1 is output based on the clock signal CLKp. The variable delay circuits 701 to 715 receive the clock signal CLKp, are coupled in series in a loop arrangement. Each of the variable delay circuits 701 to 715 performs delaying operations. The phase comparator 721 compares the phase of the pulse signal P1, which is input to the variable delay circuit 701 arranged at the first stage of the variable delay circuits 701 to 715, with the phase of the pulse signal P0, which is output from the variable delay circuit 715 arranged at the final stage of the variable delay circuits 701 to 715. The low-pass filter 722 removes frequency components included on the high-frequency side of the comparison result signal of the phase comparator 721, and outputs the resultant signal to the current control circuit 723. The current control circuit 723 controls the current of the variable delay circuits 701 to 715 to control the delay time of the variable delay circuits 701 to 715 so that the phases of the two pulse signals P0 and P1, which the phase comparator 721 compares, may be substantially the same. The delay time of the variable delay circuits 701 to 715 is substantially the same. This feedback control enables the phases of the pulse signals P0 and P1 to be substantially the same. The six pulse signals P1 to P6 are signals that are input to the variable delay circuits 701 to 706, respectively, and are delayed by the step time $\Delta t$ of 20 ps.

The 15-phase clock generator 607 generates a 15-phase clock signal and outputs the six pulse signals P1 to P6 included in the 15-phase clock signal. When the eight pieces of digital data "000" to "111" is modulated, the six pulse signals P1 to P6 are output to generate the six partial-period transmission signals S1 to S6 exclusive of the whole-period non-transmission signal S0 and the whole-period transmission signal S7. The use of the 15 variable delay circuits 701 to 715 has an advantage in that the step time $\Delta t$ of 20 ps may be obtained by the following integer arithmetic: 300 ps÷15, where the 1-symbol length Ts2 is 300 ps. The 1-symbol length Ts2 is a positive integral multiple of the step time $\Delta t$.

Figure 8:
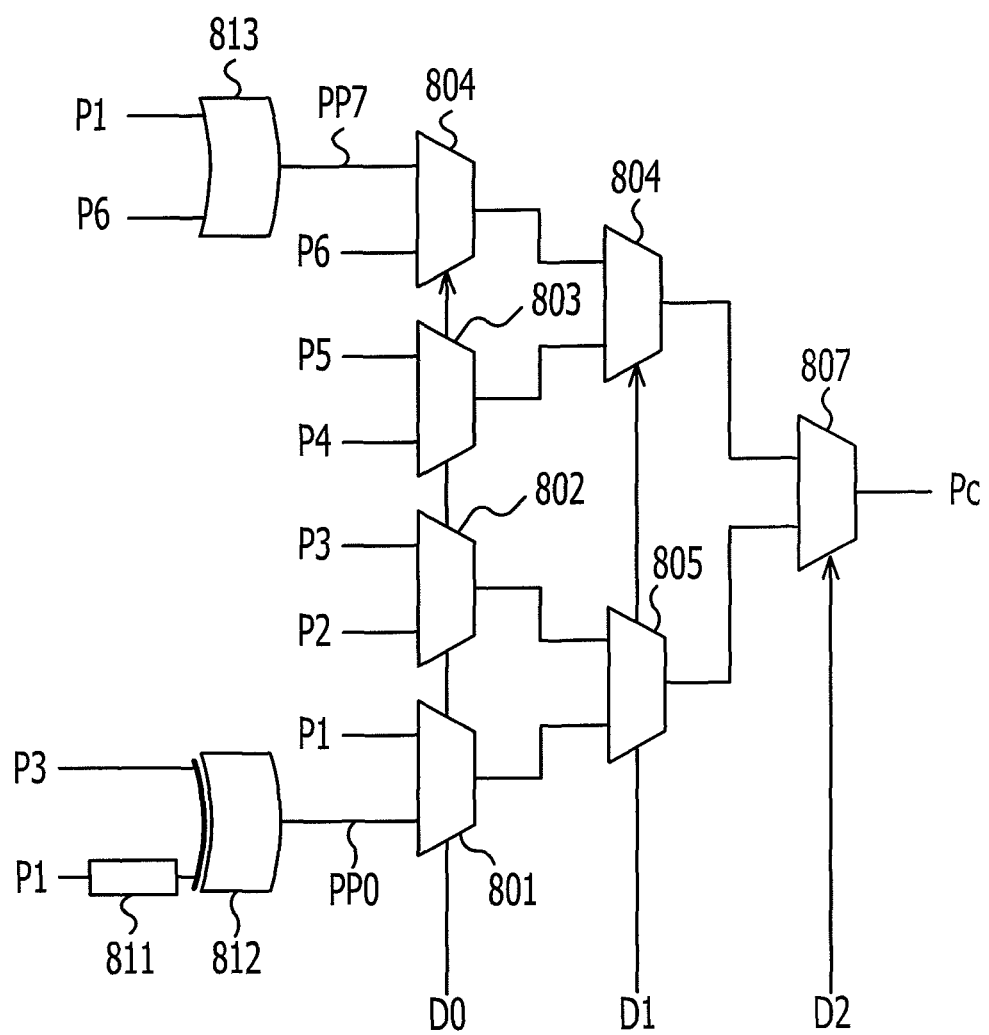
FIG. 8 illustrates an example of a selector in FIG. 6.
Figure 9:
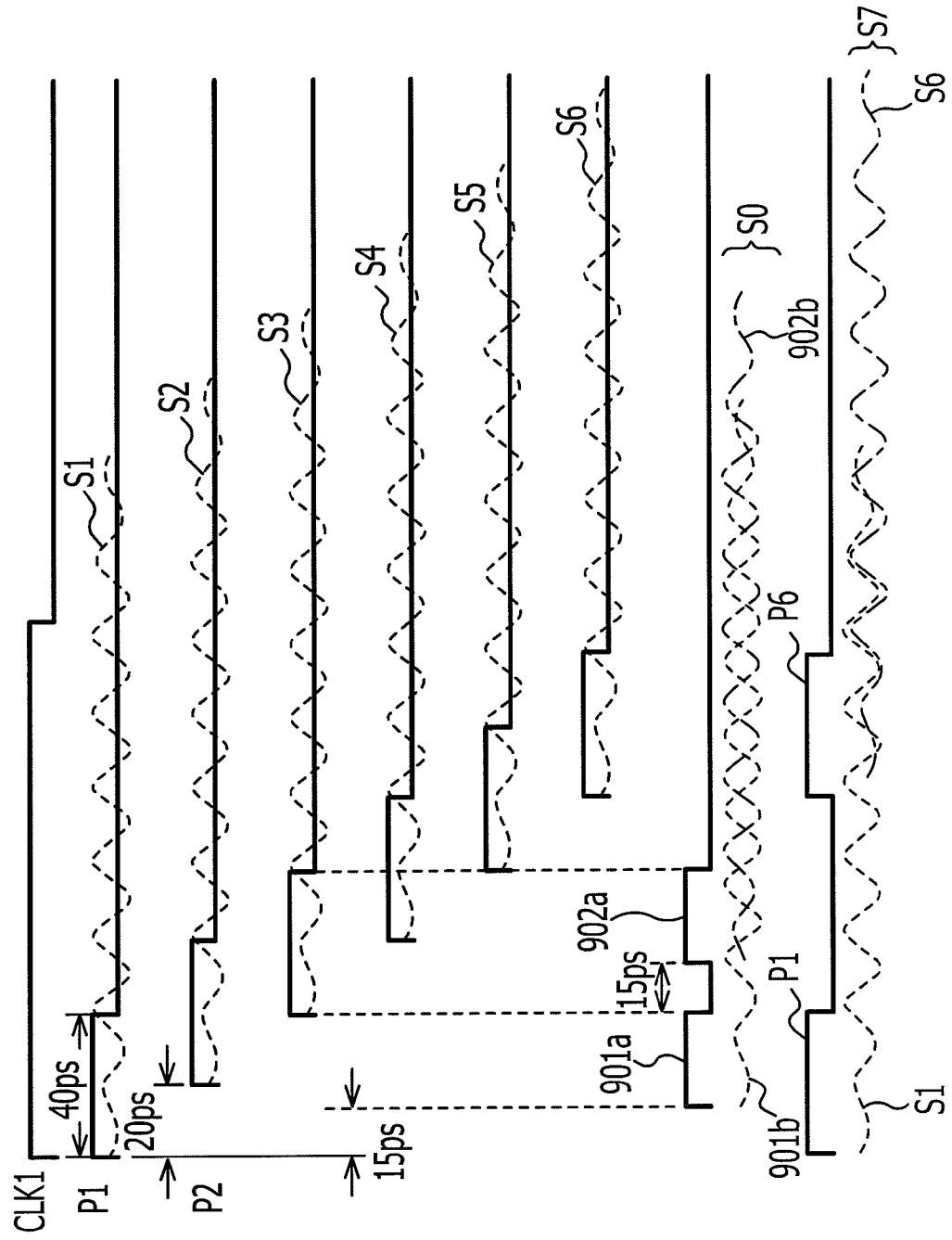
FIG. 9 illustrates timing diagrams that depict examples of operations of the selector in FIG. 6.

FIG. 8 illustrates an example of the selector 608 in FIG. 6. FIG. 9 illustrates timing diagrams that depict examples of operations of the selector 608. The selector 608 includes a delay circuit 811, an exclusive OR circuit 812, an OR circuit 813, and selectors 801 to 807, receives the pulse signals P1 to P6, and outputs a pulse signal Pc based on the 3-bit digital data D0 to D3. The delay circuit 811 delays the pulse signal P1 by 15 ps and outputs the delayed signal. The exclusive OR circuit 812 outputs an exclusive OR signal of the output signal of the delay circuit 811 and the pulse signal P3 as a pulse signal PP0. The OR circuit 813 outputs an OR signal of the pulse signals P1 and P6 as a pulse signal PP7.

When the digital data D0 indicates "1," the selector 801 outputs the pulse signal P1. When the digital data D0 indicates "0," the selector 801 outputs the pulse signal PP0. When the digital data D0 indicates "1," the selector 802 outputs the pulse signal P3. When the digital data D0 indicates "0," the selector 802 outputs the pulse signal P2. When the digital data D0 indicates "1," the selector 803 outputs the pulse signal P5. When the digital data D0 indicates "0," the selector 803 outputs the pulse signal P4. When the digital data D0 indicates "1," the selector 804 outputs the pulse signal PP7. When the digital data D0 indicates "0," the selector 804 outputs the pulse signal P6

When the digital data D1 indicates "1," the selector 805 outputs the output signal of the selector 802. When the digital data D1 indicates "0," the selector 805 outputs the output signal of the selector 801. When the digital data D1 indicates "1," the selector 806 outputs the output signal of the selector 804. When the digital data D1 indicates "0," the selector 806 outputs the output signal of the selector 803. When the digital data D2 indicates "1," the selector 807 outputs the output signal of the selector 806 as the pulse signal Pc. When the digital data D2 indicates "0," the selector 807 outputs the output signal of the selector 805 as the pulse signal Pc.

That is, when the digital data D0 to D2 indicate "000," the pulse signal Pc to be output is the pulse signal PP0. When the digital data D0 to D2 indicate "001," the pulse signal Pc to be output is the pulse signal P1. When the digital data D0 to D2 indicate "010," the pulse signal Pc to be output is the pulse signal P2. When the digital data D0 to D2 indicate "011," the pulse signal Pc to be output is the pulse signal P3. When the digital data D0 to D2 indicate "100," the pulse signal Pc to be output is the pulse signal P4. When the digital data D0 to D2 indicate "101," the pulse signal Pc to be output is the pulse signal P5. When the digital data D0 to D2 indicate "110," the pulse signal Pc to be output is the pulse signal P6. When the digital data D0 to D2 indicate "111," the pulse signal Pc to be output is the pulse signal PP7.

For example, the clock signal CLK1 is a clock signal of 3.33 GHz. The pulse signals P1 to P6 that have approximately the same pulse width (=40 ps) and have phases different from each other by 20 ps. The partial-period transmission pulses P1 to P6 are pulses for generating the partial-period transmission signals S1 to S6 in FIG. 2. The pulse signal PP0 is a whole-period non-transmission pulse that includes a first pulse 901a and a second pulse 902a, and is a pulse for generating the whole-period non-transmission signal S0 in FIG. 2. The pulse signal PP7 is a whole-period transmission pulse that includes the third pulse P1 and the fourth pulse P6, and is a pulse for generating the whole-period transmission signal S7 in FIG. 2.

For example, the short pulse generator 503 in FIG. 6 may be made up of an indium phosphide-based high electron mobility transistor (HEMT). The delay circuit 611 delays the pulse signal Pc by 10 ps and outputs the delayed pulse signal Pc. The AND circuit 612 generates a short pulse having a half value width of 10 ps by outputting an AND signal of the output signal of the delay circuit 611 and the pulse signal Pc. The band pass filter 504 passes frequency components within a pass frequency band from 97.5 to 102.5 GHz, which are included in the output signal of the short pulse generator 503, and outputs the RF pulse 522 that oscillates with the center frequency of 100 GHz and has a half width of 200 ps ($=5$ $GHz^{-1}$).

In FIG. 9, when the selector 608 outputs the partial-period transmission pulse P1, the band pass filter 504 outputs the partial-period transmission signal S1. When the selector 608 outputs the partial-period transmission pulse P2, the band pass filter 504 outputs the partial-period transmission signal S2. When the selector 608 outputs the partial-period transmission pulse P3, the band pass filter 504 outputs the partial-period transmission signal S3. When the selector 608 outputs the partial-period transmission pulse P4, the band pass filter 504 outputs the partial-period transmission signal S4. When the selector 608 outputs the partial-period transmission pulse P5, the band pass filter 504 outputs the partial-period transmission signal S5. When the selector 608 outputs the partial-period transmission pulse P6, the band pass filter 504 outputs the partial-period transmission signal S6.

When the selector 608 outputs the whole-period non-transmission pulse PP0, the band pass filter 504 outputs the whole-period non-transmission signal S0. The whole-period non-transmission pulse PP0 includes the first pulse 901a and the second pulse 902a. For example, the interval between the first pulse 901a and the second pulse 902a is 15 ps. Accordingly, when fc represents the center frequency of the pass frequency band of the band pass filter 504 and k represents a positive integer, the second pulse 902a having the pulse width reduced by the short pulse generator 503 is generated after $(2 \times k-1)/(2 \times fc)$ seconds after the generation of the first pulse 901a having the pulse width reduced by the short pulse generator 503. For example, the center frequency fc is 100 GHz and $1/(2 \times fc)$ is 5 ps. An output signal 901b of the band pass filter 504 is a signal corresponding to the first pulse 901a. An output signal 902b of the band pass filter 504 is a signal corresponding to the second pulse 902a. When the selector 608 selects the whole-period non-transmission pulse PP0, the band pass filter 504 outputs the whole-period non-transmission signal S0 attenuated by superimposing the signals 901b and 902b with the opposite phases on each other and offsetting each other. For example, each of the first pulses 901a and 902a included in the whole-period non-transmission pulse PP0 has the pulse width of 25 ps and the interval of 15 ps, which is 3/2 times longer than the pulse oscillation cycle Tc of 10 ps. Accordingly, when the whole-period transmission pulse PP0 is selected, the signals 901b and 902b with the opposite phases are offset by each other and the whole-period non-transmission signal S0 may be generated.

When the selector 608 outputs the whole-period transmission pulse PP7, the band pass filter 504 outputs the whole-period transmission signal S7. The whole-period transmission pulse PP7 includes the third pulse P1 and the fourth pulse P6. The pulses P1 and P6 are preferably separated. Accordingly, when m represents a positive integer, the fourth pulse P6 having the pulse width reduced by the short pulse generator 503 is generated after m/fc seconds after the generation of the third pulse P1 having the pulse width reduced by the short pulse generator 503. For example, the center frequency fc is 100 GHz, and 1/fc is 10 ps. The output signal S1 of the band pass filter 504 is a signal corresponding to the third pulse P1. The output signal S6 of the band pass filter 504 is a signal corresponding to the fourth pulse P6. When the selector 608 selects the whole-period transmission pulse PP7, the band pass filter 504 outputs the whole-period transmission signal S7 for which the signals S1 and S6 with approximately the same phase are superimposed on each other. The pulse signals P1 and P6 of the whole-period transmission pulse PP7 are serial signals that have the pulse width of 40 ps and the interval of 60 ps, which is six times longer than the pulse oscillation cycle Tc of 10 ps. Accordingly, when the whole-period transmission pulse PP7 is selected, where the pulse signals P1 and P6 are superimposed on each other and the whole-period transmission signal S7 where the whole-period oscillation state is maintained may be generated.

As described above, the 15-phase clock generator 607, the delay circuit 811, the exclusive OR circuit 812, and the OR circuit 813 generate the $2^N$ pulse signal PP0, P1 to P6, and PP7 corresponding to the N-bit digital data D0 to D2. The selector 608 selects one of the $2^N$ pulse signals PP0, P1 to P6, and PP7 generated by the 15-phase clock generator 607 etc. based on the N-bit digital data D0 to D2 generated by the baseband signal generator 501.

The $2^N$ pulse signals PP0, P1 to P6, and PP7 generated by the 15-phase clock generator 607 etc. include the whole-period non-transmission pulse PP0 that includes the first pulse 901a and the second pulse 902a, the whole-period transmission pulse PP7 that includes the third pulse P1 and the fourth pulse P6, and the $2^N-2$ partial-period transmission pulses P1 to P6 that have approximately the same pulse width and have different phases.

When the selector 608 selects the partial-period transmission pulses P1 to P6, the band pass filter 504 outputs the partial-period transmission signals S1 to S6 that have the time widths Tw, each of which is smaller than the 1-symbol length Ts2.

The output signal of the band pass filter 504, which is obtained when the selector 608 selects one of the $2^N-2$ partial-period transmission pulses P1 to P6 as a first partial-period transmission pulse, and the output signal of the band pass filter 504, which is obtained when the selector 608 selects a partial-period transmission pulse other than the first partial-period transmission pulse from the $2^N-2$ partial-period transmission pulses P1 to P6, have approximately the same time width Tw and have different phases.

When the selector 608 selects the whole-period non-transmission pulse PP0, the band pass filter 504 outputs the whole-period non-transmission signal S0 attenuated by mutually offsetting the signal 901b corresponding to the first pulse 901a and the signal 902b corresponding to the second pulse 902a. When the selector 608 selects the whole-period transmission pulse PP7, the band pass filter 504 outputs the whole-period transmission signal S7 that has the time width substantially equal to the 1-symbol length Ts2.

Each of the phase differences between the output signals S1 to S6 of the band pass filter 504, which correspond to the $2^N-2$ partial-period transmission pulses P1 to P6, is a positive integral multiple of the step time Δt. When Tw represents each of the time widths of the output signals S1 to S6 of the band pass filter 504, which correspond to the $2^N-2$ partial-period transmission pulses P1 to P6, the 1-symbol length Ts2 may be expressed by $(2^N-3) \times \Delta t + Tw$.

In reference to FIGS. 7 and 8, the whole-period transmission pulse PP7 is an OR signal of the pulse signal P1 input to the variable delay circuit 701, which is the first circuit of the Ts/Δt variable delay circuits 701 to 715, and the pulse signal P6 input to the variable delay circuit 706, which is the $2^N-2$th circuit of the Ts/Δt variable delay circuits 701 to 715. The whole-period non-transmission pulse PP0 is an exclusive OR signal of a pulse signal obtained by delaying the pulse signal P1 input to the variable delay circuit 701 by a time corresponding to a positive integral multiple of $1/(2×fc)$, and the pulse signal P3 input to the variable delay circuit 703. When p represents a positive integer, the variable delay circuit 701 is the pth variable delay circuit included in the Ts/Δt variable delay circuits 701 to 715, and the variable delay circuit 703 is the p+2th variable delay circuit included in the Ts/Δt variable delay circuits 701 to 715. The $2^N-2$ partial-period transmission pulses P1 to P6 are pulse signals input to the first to $2^N$-2th variable delay circuits 701 to 706, respectively, and the variable delay circuits 701 to 706 are included in the Ts/Δt variable delay circuits 701 to 715.

Figure 10:
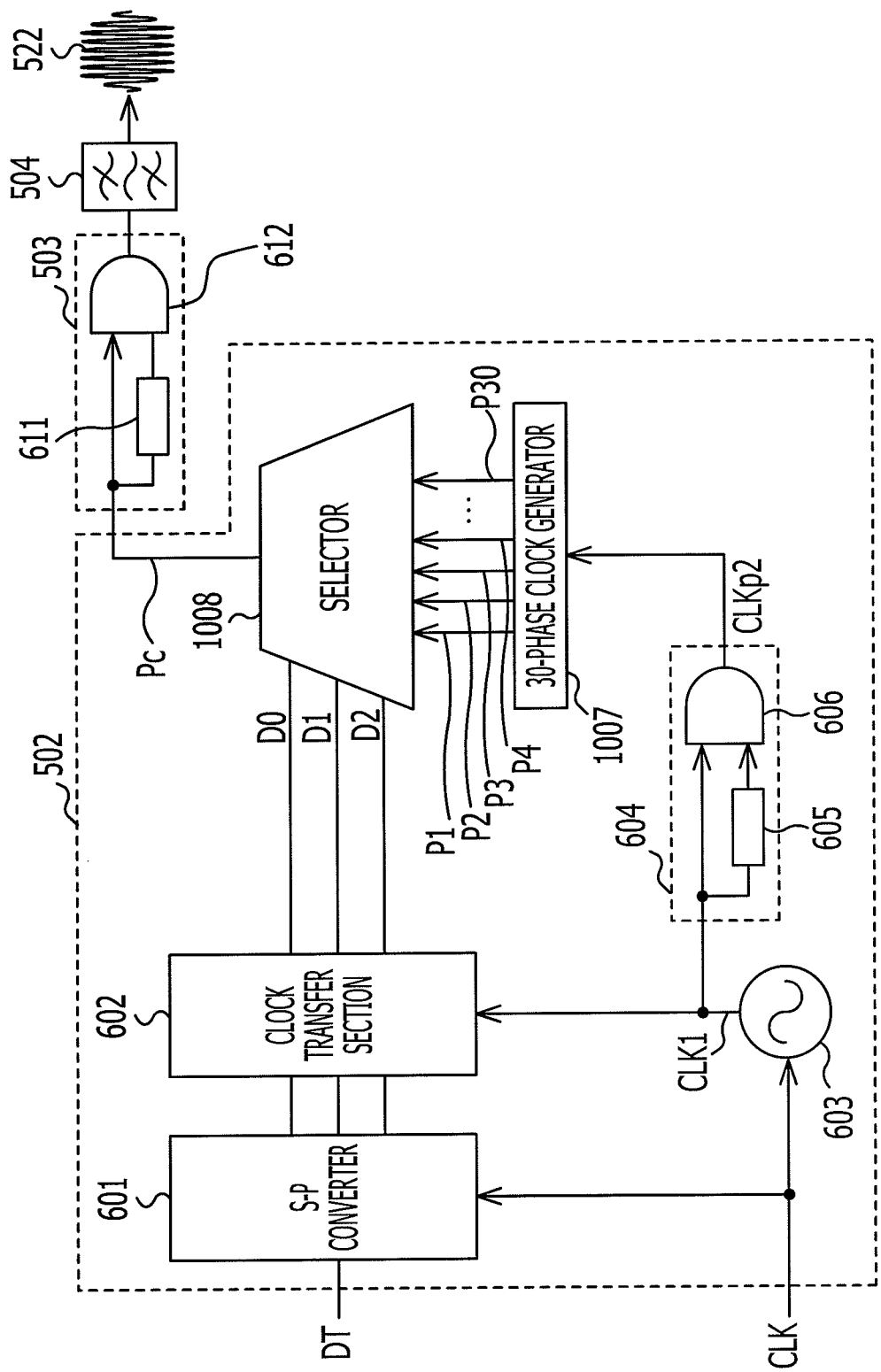
FIG. 10 illustrates examples of a pulse generator, a short pulse generator, and a band pass filter according to Embodiment 2.

FIG. 10 illustrates examples of a pulse generator 502, a short pulse generator 503, and a band pass filter 504 according to Embodiment 2. The differences between Embodiments 1 and 2 are described below. The pulse generator 502 in FIG. 10 includes a 30-phase clock generator 1007 and a selector 1008 instead of the 15-phase clock generator 607 and the selector 608 in the pulse generator 502 in FIG. 6. For example, in Embodiment 2, the pass frequency band of the band pass filter 504 is from 47.5 to 52.5 GHz and a center frequency fc of the band pass filter 504 is 50 GHz. For example, an RF pulse 522 that the band pass filter 504 in FIG. 10 outputs has a time width Tw of 200 ps and an oscillation cycle Tc of 20 ps. A clock signal CLKp2 is an output signal of an AND circuit 606. The high level period of the clock signal CLKp2 may be 2.5×Δt=2.5×20 ps=50 ps. The 30-phase clock generator 1007 receives the clock signal CLKp2 and outputs 30-phase pulse signals P1 to P30.

Figure 11A:
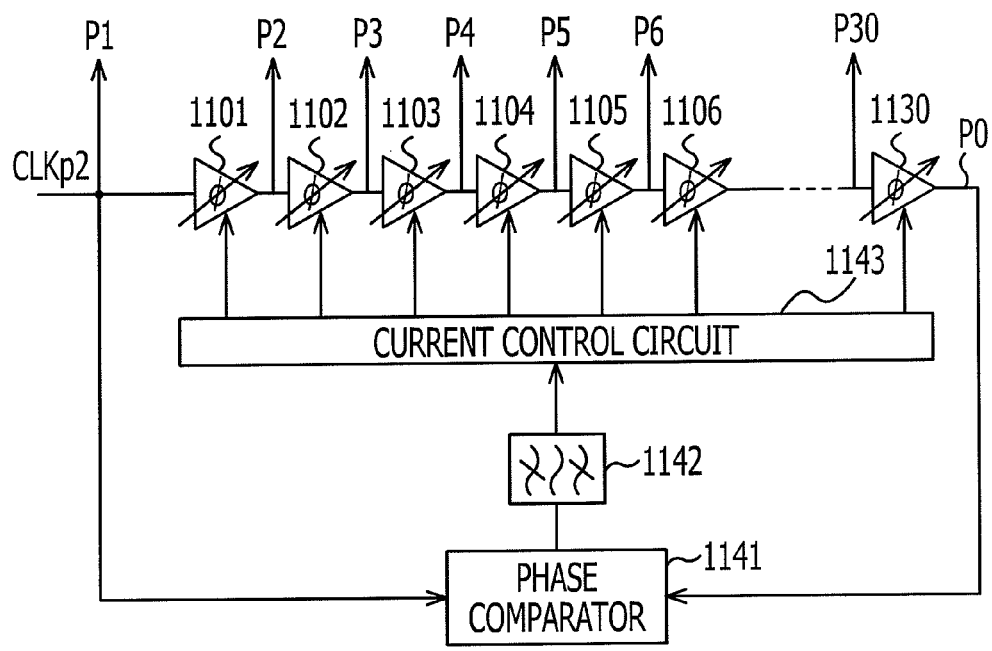
FIG. 11A illustrates an example of a 30-phase clock generator.
Figure 11B:
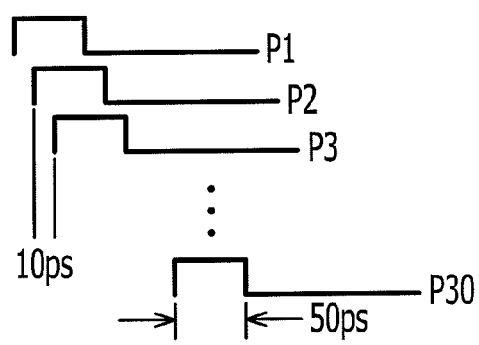
FIG. 11B illustrates examples of pulse signals generated by the 30-phase clock generator.

FIG. 11A illustrates an example of the 30-phase clock generator 1007. FIG. 11B illustrates examples of the pulse signals P1 to P30 generated by the 30-phase clock generator 1007. The 30-phase clock generator 1007 may be a DLL circuit that includes 30 variable delay circuits 1101 to 1130, a phase comparator 1141, a low-pass filter 1142, and a current control circuit 1143.

The pulse signal P1 according to Embodiment 2 is output based on the clock signal CLKp2. The variable delay circuits 1101 to 1130 receive the clock signal CLKp2, and are coupled in series in a loop arrangement. Each of the variable delay circuits 1101 to 1130 performs delaying operations. The phase comparator 1141 compares the phase of the pulse signal P1 input to the variable delay circuit 1101 arranged at the first stage of the variable delay circuits 1101 to 1130 with the phase of the pulse signal P0 output from the variable delay circuit 1130 arranged at the final stage of the variable delay circuits 1101 to 1130. The low-pass filter 1142 removes frequency components included on the high-frequency side of the comparison result signal of the phase comparator 1141, and outputs the resultant signal to the current control circuit 1143. The current control circuit 1143 controls the current of the variable delay circuits 1101 to 1130 to control the delay time of the variable delay circuits 1101 to 1130 so that the phases of the two pulse signals P0 and P1, which the phase comparator 1141 compares, may be substantially the same. The delay time of the variable delay circuits 1101 to 1130 is substantially the same. This feedback control enables the phases of the pulse signals P0 and P1 to be substantially the same. The 30 pulse signals P1 to P30 are input signals of the variable delay circuits 1101 to 1130, respectively, which are delayed by 10 ps and have the pulse width of 50 ps.

Figure 12:
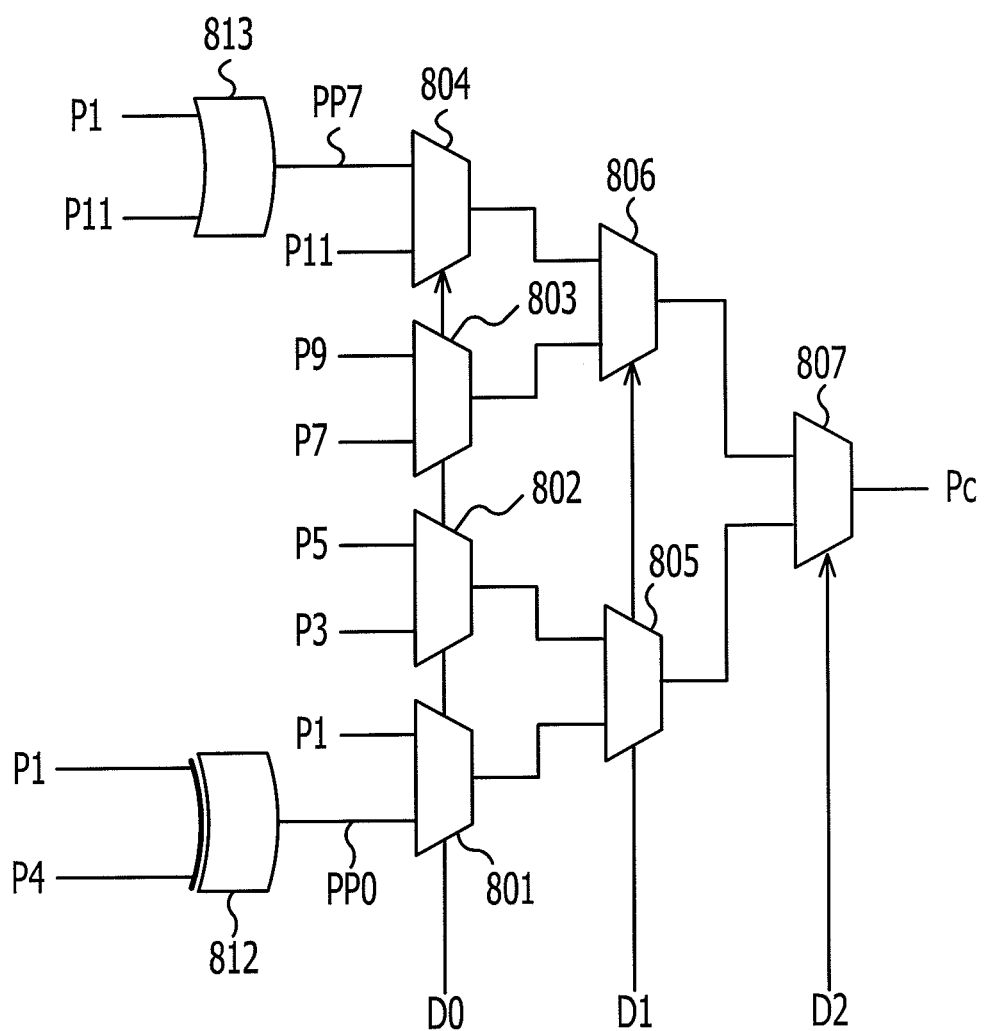
FIG. 12 illustrates an example of a selector in FIG. 10.
Figure 13:
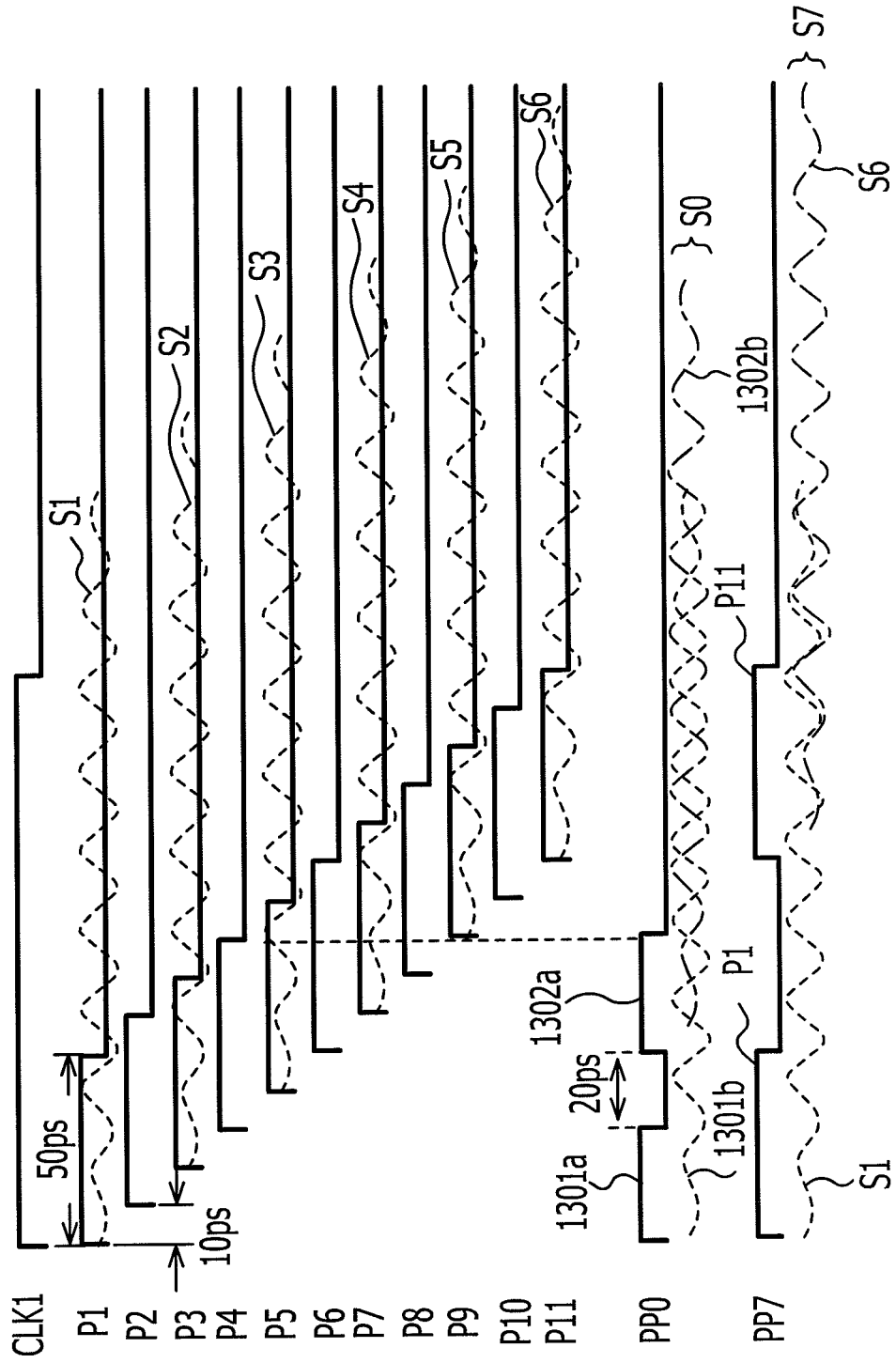
FIG. 13 illustrates timing diagrams for explaining operations of the selector in FIG. 10.

FIG. 12 illustrates an example of the selector 1008 in FIG. 10. FIG. 13 illustrates timing diagrams for explaining operations of the selector 1008. The delay circuit 811 of the selector 608 in FIG. 8 is omitted in the selector 1008 in FIG. 12. The differences between the selector 1008 in FIG. 12 and the selector 608 in FIG. 8 are described below. An exclusive OR circuit 812 in FIG. 12 outputs an exclusive OR signal of the pulse signals P1 and P4 as a whole-period non-transmission pulse PP0. An OR circuit 813 in FIG. 12 outputs an OR signal of the pulse signals P1 and P11 as a whole-period transmission pulse PP7.

When digital data D0 indicates "1," a selector 801 in FIG. 12 outputs the pulse signal P1. When the digital data D0 indicates "0," the selector 801 in FIG. 12 outputs the whole-period non-transmission pulse PP0. When the digital data D0 indicates "1," a selector 802 in FIG. 12 outputs the pulse signal P5. When the digital data D0 indicates "0," the selector 802 in FIG. 12 outputs the pulse signal P3. When the digital data D0 indicates "1," a selector 803 in FIG. 12 outputs the pulse signal P9. When the digital data D0 indicates "0," the selector 803 in FIG. 12 outputs the pulse signal P7. When the digital data D0 indicates "1," a selector 804 outputs the whole-period transmission pulse PP7. When the digital data D0 indicates "0," the selector 804 in FIG. 12 outputs the pulse signal P11.

In other words, when the digital data D0, and digital data D1 and D2 indicate "000," a pulse signal Pc to be output is the whole-period non-transmission pulse PP0. When the digital data D0 to D2 indicate "001," the pulse signal Pc to be output is the pulse signal P1. When the digital data D0 to D2 indicate "010," the pulse signal Pc to be output is the pulse signal P3. When the digital data D0 to D2 indicate "011," the pulse signal Pc to be output is the pulse signal P5. When the digital data D0 to D2 indicate "100," the pulse signal Pc to be output is the pulse signal P7. When the digital data D0 to D2 indicate "101," the pulse signal Pc to be output is the pulse signal P9. When the digital data D0 to D2 indicate "110," the pulse signal Pc to be output is the pulse signal P11. When the digital data D0 to D2 indicate "111," the pulse signal Pc to be output is the pulse signal PP7.

For example, in Embodiment 2, the frequency of a clock signal CLK1 is 3.33 GHz. The pulse signals P1 to P11 have approximately the same pulse width (=50 ps) and have phases different from each other by 10 ps. The pulse signals P1, P3, P5, P7, P9, and P11 are partial-period transmission pulses that have approximately the same pulse width (=50 ps) and have phases different from each other by 20 ps. The partial-period transmission pulses P1, P3, P5, P7, P9, and P11 are pulses for generating the partial-period transmission signals S1 to S6 in FIG. 2. The pulse signal PP0 is a whole-period non-transmission pulse that includes a first pulse 1301a and a second pulse 1302a, and is a pulse for generating the whole-period non-transmission signal S0 in FIG. 2. The pulse signal PP7 is a whole-period transmission pulse that includes the third pulse P1 and the fourth pulse P11, and is a pulse for generating the whole-period transmission signal S7 in FIG. 2.

When the selector 1008 outputs the partial-period transmission pulse P1, the band pass filter 504 outputs the partial-period transmission signal S1. When the selector 1008 outputs the partial-period transmission pulse P3, the band pass filter 504 outputs the partial-period transmission signal S2. When the selector 1008 outputs the partial-period transmission pulse P5, the band pass filter 504 outputs the partial-period transmission signal S3. When the selector 1008 outputs the partial-period transmission pulse P7, the band pass filter 504 outputs the partial-period transmission signal S4. When the selector 1008 outputs the partial-period transmission pulse P9, the band pass filter 504 outputs the partial-period transmission signal S5. When the selector 1008 outputs the partial-period transmission pulse P11, the band pass filter 504 outputs the partial-period transmission signal S6.

When the selector 1008 outputs the whole-period non-transmission pulse PP0, the band pass filter 504 outputs the whole-period non-transmission signal S0. The whole-period non-transmission pulse PP0 includes the first pulse 1301a and the second pulse 1302a. For example, the interval between the first pulse 1301a and the second pulse 1302a is 20 ps. An output signal 1301b of the band pass filter 504 is a signal corresponding to the output signal 1301a. An output signal 1302b of the band pass filter 504 is a signal corresponding to the second pulse 1302a. When the selector 1008 selects the whole-period non-transmission pulse PP0, the band pass filter 504 outputs the whole-period non-transmission signal S0 attenuated by superimposing the signals 1301b and 1302b with opposite phases on each other and offsetting each other.

When the selector 1008 outputs the whole-period transmission pulse PP7, the band pass filter 504 outputs the whole-period transmission signal S7. The whole-period transmission pulse PP7 includes the third pulse P1 and the fourth pulse P11. The output signal S1 of the band pass filter 504 is a signal corresponding to the third pulse P1. The output signal S6 of the band pass filter 504 is a signal corresponding to the fourth pulse P11. When the selector 1008 selects the whole-period transmission pulse PP7, the band pass filter 504 outputs the whole-period transmission signal S7 for which the signals S1 and S6 with approximately the same phase are superimposed on each other.

The OR circuit 813 is not limited to the above when the OR circuit 813 outputs an OR signal of an Xth pulse signal and another Xth pulse signal, where X represents an odd number, or outputs an OR signal of a Yth pulse signal and another Yth pulse signal, where Y represents an even number. The exclusive OR circuit 812 is not limited to the above when the exclusive OR circuit 812 outputs an exclusive OR signal of an Xth pulse signal, where X represents an odd number, and a Yth pulse signal, where Y represents an even number.

As described above, the whole-period transmission pulse PP7 is an OR signal of a pulse signal input to an Xth variable delay circuit included in the variable delay circuits 1101 to 1130, and a pulse signal input to another Xth variable delay circuit included in the variable delay circuits 1101 to 1130, where X represents an odd number. Alternatively, the whole-period transmission pulse PP7 is an OR signal of a pulse signal input to a Yth variable delay circuit included in the variable delay circuits 1101 to 1130, and a pulse signal input to another Yth variable delay circuit included in the variable delay circuits 1101 to 1130, where Y represents an even number.

The whole-period non-transmission pulse PP0 is an exclusive OR signal of a pulse signal input to an Xth variable delay circuit included in the variable delay circuits 1101 to 1130, and a pulse signal input to a Yth variable delay circuit included in the variable delay circuits 1101 to 1130, where X represents an odd number and Y represents an even number.

The $2^N$-2 partial-period transmission pulses P1, P3, P5, P7, P9, and P11 are pulse signals input to $2^N$-2 Xth different variable delay circuits that are included in the variable delay circuits 1101 to 1130, where X represents an odd number.

Since the delay circuit 811 used in Embodiment 1 may be omitted in Embodiment 2, the circuit scale according to Embodiment 2 may be smaller than the circuit scale according to Embodiment 1.

As described above, according to Embodiment 1 or 2, the transmission speed of the impulse radio communication apparatus may be 10 Gbps, which is increased by approximately 13.3% when compared with the transmission speed of the impulse radio communication apparatus illustrated in FIG. 1; and as a result, a large amount of data may be transmitted.

All examples and conditional language recited herein are intended for pedagogical purposes only so as to aid the reader in understanding the invention and the concepts contributed by the inventor to furthering the art, and are to be construed as being without limitation to such specifically recited examples and conditions. Although the embodiments of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A radio communication apparatus, comprising:
   a baseband signal generator configured to generate digital data;
   a clock generator configured to generate $2^N$ pulse signals corresponding to the digital data having N bits, where N represents an integer being at least two;
   a selector configured to select one of the $2^N$ pulse signals generated by the clock generator based on the N-bit digital data generated by the baseband signal generator;
   a short pulse generator configured to reduce a pulse width of the pulse signal selected by the selector;
   a band pass filter configured to pass a frequency component included in a pass frequency band and attenuate a frequency component not included in the pass frequency band, the frequency components making up the pulse signal having the pulse width reduced by the short pulse generator;
   an antenna configured to perform radio transmission of a signal passed through the band pass filter, wherein
   the $2^N$ pulse signals include a whole-period non-transmission pulse, a whole-period transmission pulse, and $2^N$-2 partial-period transmission pulses, the whole-period non-transmission pulse including a first pulse and a second pulse, the whole-period transmission pulse including a third pulse and a fourth pulse, the $2^N$-2 partial-period transmission pulses having approximately the same pulse widths and different phases,
   when the selector selects the partial-period transmission pulse, the band pass filter outputs a signal having a time width corresponding to part of a period having a 1-symbol length,
   the signal that the band pass filter outputs when the selector selects a first partial-period transmission pulse included in the $2^N$-2 partial-period transmission pulses, and the signal that band pass filter outputs when the selector selects a partial-period transmission pulse other than the first partial-period transmission pulse included in the $2^N$-2 partial-period transmission pulses have approximately the same time widths and different phases,
   when the selector selects the whole-period non-transmission pulse, the band pass filter outputs a signal attenuated by offsetting a signal corresponding to the first pulse and a signal corresponding to the second pulse, and when the selector selects the whole-period transmission pulse, the band pass filter outputs a signal having a time width corresponding to a whole of the period having the 1-symbol length.

2. The radio communication apparatus according to claim 1, wherein
the short pulse generator generates an impulse.

3. The radio communication apparatus according to claim 1, wherein
each difference between the phases of the output signals of the band pass filter is a positive integral multiple of a step time $\Delta t$, the output signals of the band pass filter corresponding to the $2^N-2$ partial-period transmission pulses.

4. The radio communication apparatus according to claim 3, wherein
the 1-symbol length is $(2^N-3) \times \Delta t + Tw$, where Tw represents each of the time widths of the output signals of the band pass filter, the output signals of the band pass filter corresponding to the $2^N-2$ partial-period transmission pulses.

5. The radio communication apparatus according to claim 4, wherein
the second pulse having the pulse width reduced by the short pulse generator is generated after $(2 \times k-1)/(2 \times fc)$ seconds after the generation of the first pulse having the pulse width reduced by the short pulse generator, where fc represents a center frequency of the pass frequency band of the band pass filter and k represents a positive integer, and
when the selector selects the whole-period non-transmission pulse, the band pass filter outputs a signal attenuated by superimposing a signal corresponding to the first pulse and a signal corresponding to the second pulse and offsetting each other, the signals corresponding to the first pulse and the second pulse having opposite phases.

6. The radio communication apparatus according to claim 5, wherein
the fourth pulse having the pulse width reduced by the short pulse generator is generated after m/fc seconds after the generation of the third pulse having the pulse width reduced by the short pulse generator, where m represents a positive integer, and
when the selector selects the whole-period transmission pulse, the band pass filter outputs a signal obtained by superimposing a signal corresponding to the third pulse and a signal corresponding to the fourth pulse on each other, the signals corresponding to the third pulse and the fourth pulse having substantially the same phases.

7. The radio communication apparatus according to claim 5, wherein
the 1-symbol length is a positive integral multiple of the step time $\Delta t$, and the step time $\Delta t$ is a positive integral multiple of 1/fc.

8. The radio communication apparatus according to claim 4, wherein
the clock generator includes:
a plurality of variable delay circuits configured to receive a clock signal and coupled in series in a loop arrangement, each of the plurality of variable delay circuits being configured to perform delaying operations;
a phase comparator configured to compare a phase of a pulse signal input to a variable delay circuit arranged at a first stage of the plurality of variable delay circuits with a phase of a pulse signal output from a variable delay circuit arranged at a final stage of the plurality of variable delay circuits; and
a control circuit configured to control delay time of the plurality of variable delay circuits to cause the phases of the two pulse signals compared by the phase comparator to be substantially the same.

9. The radio communication apparatus according to claim 8, wherein
the clock generator further includes a low-pass filter configured to remove a frequency component included on a high-frequency side of a signal output from the phase comparator and output a resultant signal to the control circuit.

10. The radio communication apparatus according to claim 8, wherein
the whole-period transmission pulse is an OR signal of a pulse signal input to a first variable delay circuit and a pulse signal input to a $2^N$-2th variable delay circuit, included in the first variable delay circuit and the $2^N$-2th variable delay circuit being included in the plurality of variable delay circuits,
the whole-period non-transmission pulse is an exclusive OR signal of a pulse signal obtained by delaying a pulse signal input to a pth variable delay circuit by time corresponding to a positive integral multiple of $1/(2 \times fc)$, and a pulse signal input to a p+2th variable delay circuit, where p represents a positive integer, the pth variable delay circuit and the p+2th variable delay circuit being included in the plurality of variable delay circuits, and
the $2^N$-2 partial-period transmission pulses are pulse signals input to the first variable delay circuit, the $2^N$-2th variable delay circuit, and variable delay circuits between the first variable delay circuit and the $2^N$-2th variable delay circuit, the variable delay circuits between the first variable delay circuit and the $2^N$-2th variable delay circuit being also included in the plurality of variable delay circuits.

11. The radio communication apparatus according to claim 8, wherein
the whole-period transmission pulse is an OR signal of a pulse signal input to an Xth variable delay circuit and a pulse signal input to another Xth variable delay circuit, where X represents an odd number, the Xth variable delay circuits being included in the plurality of variable delay circuits, or an OR signal of a pulse signal input to a Yth variable delay circuit and a pulse signal input to another Yth variable delay circuit, where Y represents an even number, the Yth variable delay circuits being included in the plurality of variable delay circuits,
the whole-period non-transmission pulse is an exclusive OR signal of a pulse signal input to an Xth variable delay circuit included in the plurality of variable delay circuits, and a pulse signal input to a Yth variable delay circuit of the plurality of variable delay circuits, where X represents an odd number and Y represents an even number, and
the $2^N$-2 partial-period transmission pulses are pulse signals input to $2^N$-2 different Xth variable delay circuits included in the plurality of variable delay circuits, where X represents an odd number.

* * * * *